United States Patent
Lu

[11] Patent Number: 5,827,394
[45] Date of Patent: Oct. 27, 1998

[54] STEP AND REPEAT EXPOSURE METHOD FOR LOOSENING INTEGRATED CIRCUIT DICE FROM A RADIATION SENSITIVE ADHESIVE TAPE BACKING

[75] Inventor: Chih-Yuan Lu, Hsinchu, Taiwan

[73] Assignee: Vanguard International Semiconductor Corporation, Hsin-Chu, Taiwan

[21] Appl. No.: 999,614

[22] Filed: Sep. 25, 1997

Related U.S. Application Data

[63] Continuation of Ser. No. 679,915, Jul. 15, 1996, abandoned.

[51] Int. Cl.$^6$ .................................................. B32B 35/00
[52] U.S. Cl. .......................... 156/344; 156/584; 438/464; 29/426.3; 29/426.5
[58] Field of Search .................................. 156/344, 584; 438/464; 29/426.1, 426.3, 426.5

[56] References Cited

U.S. PATENT DOCUMENTS

| | | | |
|---|---|---|---|
| 5,098,501 | 3/1992 | Nishiguchi | 156/344 X |
| 5,266,528 | 11/1993 | Yamada | 437/226 |
| 5,270,260 | 12/1993 | Scheuenpflug | 437/209 |
| 5,362,681 | 11/1994 | Roberts, Jr. et al. | 437/226 |
| 5,482,899 | 1/1996 | McKenna et al. | 437/225 |

FOREIGN PATENT DOCUMENTS

| | | | |
|---|---|---|---|
| 53-121832 | 10/1978 | Japan | 156/344 |
| 53-121833 | 10/1978 | Japan | 156/344 |
| 61-210650 | 9/1986 | Japan | 437/226 |
| 63-92038 | 4/1988 | Japan | 156/344 |
| 1-171238 | 7/1989 | Japan | 156/344 |
| 2-60147 | 2/1990 | Japan | 156/584 |

*Primary Examiner*—Mark A. Osele
*Attorney, Agent, or Firm*—George O. Saile; Stephen B. Ackerman; Alek P. Szecsy

[57] ABSTRACT

A method and apparatus through which there may be delaminated, within the context of a pick-and-place processing method, an integrated circuit die from an adhesive tape backing. To practice the method of the present invention, there is first provided upon an adhesive tape backing an integrated circuit die. The adhesive tape backing comprises a carrier layer and an adhesive layer formed over the carrier layer, where the adhesive layer is positioned between the integrated circuit die and the carrier layer. The adhesive layer has a first portion of the adhesive layer upon which is positioned the integrated circuit die. The adhesive character of the first portion of the adhesive layer is susceptible to substantially complete degradation through exposure to a dose of radiation. There is then exposed selectively the first portion of the adhesive layer to the dose of radiation, preferably ultra-violet (UV) radiation. Finally, the integrated circuit die is removed from the adhesive tape backing. The invention also contemplates an apparatus through which the method of the present invention may be practiced and an ultra-violet (UV) sensitive adhesive tape backing which may be employed within the method and apparatus of the invention.

11 Claims, 3 Drawing Sheets

STEP AND REPEAT EXPOSURE METHOD FOR LOOSENING INTEGRATED CIRCUIT DICE FROM A RADIATION SENSITIVE ADHESIVE TAPE BACKING

CROSS-REFERENCE TO RELATED APPLICATION

This application is a file wrapper continuation application of application Ser. No. 08/679,915, filed 15 Jul. 1996, now abandoned.

BACKGROUND OF THE INVENTION

1. Field of the Invention

The present invention relates generally to a pick and place processing method through which an integrated circuit die may be fabricated into an integrated circuit package. More particularly, the present invention relates to a step and repeat exposure method for loosening an integrated circuit die from a radiation sensitive adhesive tape backing when the integrated circuit die is fabricated into an integrated circuit package though the pick and place processing method.

2. Description of the Related Art

Integrated circuits are formed from semiconductor substrates within and upon whose surfaces are formed resistors, transistors, diodes and other electrical circuit elements. The electrical circuit elements are connected internally and externally to the semiconductor substrate upon which they are formed through patterned conductor layers which are separated by insulator layers. When forming integrated circuits within and upon semiconductor substrate wafers through integrated circuit fabrication methods as are common in the art, there are typically formed multiple integrated circuit dice (ie: integrated circuit chips) from a single semiconductor substrate wafer.

In the process of forming the multiple integrated circuit dice from the single semiconductor substrate wafer, it is common in the art of integrated circuit fabrication to mount the semiconductor substrate wafer upon an adhesive tape backing which serves to hold the semiconductor substrate wafer in place while the semiconductor substrate wafer is parted into the multiple integrated circuit dice. Typically, the semiconductor substrate wafer is parted into the multiple integrated circuit dice through a dicing method which forms several narrow kerfs completely through the semiconductor substrate wafer but only partially through the adhesive tape backing. Thus, the adhesive tape backing also serves to hold the integrated circuit dice in place to allow for positioning and selection of the integrated circuit dice during subsequent pick and place processing of the integrated circuit dice into integrated circuit packages.

In order to remove an integrated circuit die from an adhesive tape backing during pick and place processing when fabricating the integrated circuit die into an integrated circuit package, it is common in the art to employ a minimum of one ejection probe or needle positioned and tensioned against or through the side of the adhesive tape backing opposite the integrated circuit die, such that the tensioning of the ejection probe or needle parts the edges of the integrated circuit die from the adhesive tape backing, thus facilitating the removal of the integrated circuit die from the adhesive tape backing. A pair of schematic cross-sectional diagrams illustrating the results of progressive stages in parting an integrated circuit die from an adhesive tape backing through such a tensioned ejection probe method is illustrated by reference to FIG. 1 and FIG. 2.

Figure 1:
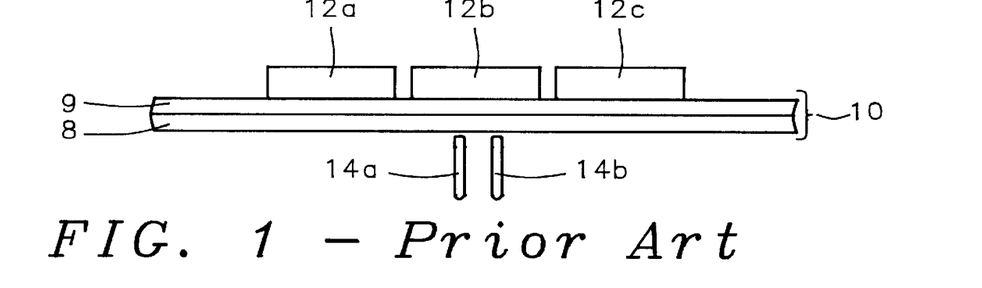
FIG. 1 and FIG. 2 show a pair of schematic cross-sectional diagrams illustrating the formation of micro-cracks within an integrated circuit die when the integrated circuit die is delaminated from an adhesive tape backing through an ejection probe tensioning method conventional in the art.

Shown in FIG. 1 is an adhesive tape backing 10 comprising a carrier layer 8 upon which is formed an adhesive layer 9. Upon the adhesive layer 9 there is positioned a series of integrated circuit dice 12a, 12b and 12c which are formed through dicing through a method as is conventional in the art of appropriate portions of a semiconductor substrate wafer originally positioned upon the adhesive layer 9. The carrier layer 8 within the adhesive tape backing 10 is typically formed from a polymer film. The adhesive layer 9 within the adhesive tape backing 10 is typically formed from a polymer adhesive material. Also illustrated in FIG. 1 is a pair of ejection probes 14a and 14b positioned beneath the carrier layer 8 at a point opposite the integrated circuit die 12b.

Figure 2:
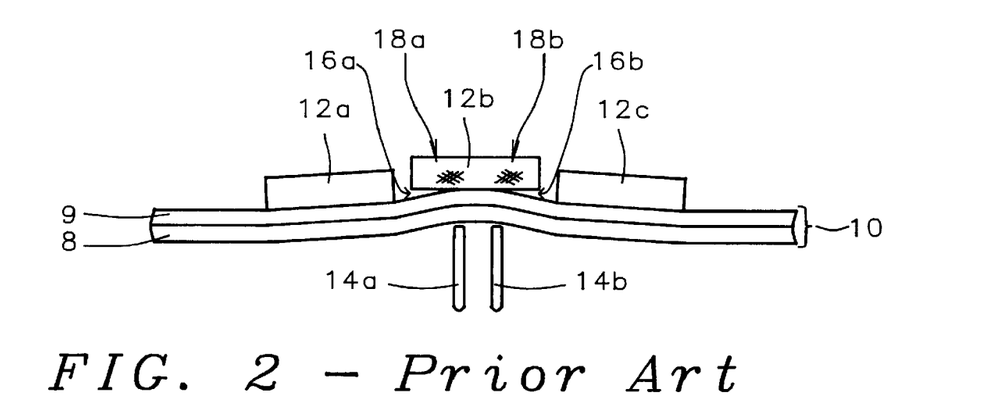

Shown in FIG. 2 is a schematic cross-sectional diagram illustrating the results of further processing of the series of integrated circuit dice 12a, 12b and 12c positioned upon the adhesive tape backing 10 as illustrated in FIG. 1. As is shown in FIG. 2, the pair of ejection probes 14a and 14b is tensioned against the surface of the carrier layer 8 opposite the integrated circuit die 12b, thus partially delaminating the integrated circuit die 12b from the adhesive layer 9, with the concomitant formation of a pair of voids 16a and 16b. Through the partial delamination of the integrated circuit die 12b from the adhesive layer 9 within the adhesive tape backing 10 there is facilitated removal of the integrated circuit die 12b from the adhesive tape backing 10 when the integrated circuit die 12b is fabricated into an integrated circuit package through a pick and place processing method. Typically, the pick and place processing method employs a vacuum wand applied to the upper surface of the integrated circuit die 12b to transfer the integrated circuit die 12b from the adhesive tape backing 10 to an integrated circuit package.

While the method employing tensioned ejection probes or needles, such as the tensioned ejection probes 14a and 14b, to partially delaminate an integrated circuit die, such as the integrated circuit die 12b, from an adhesive tape backing, such as the adhesive tape backing 10, has become quite common in the art of pick and place processing of integrated circuit dice into integrated circuit packages, the method is not entirely without problems. In particular, it is known in the art that micro-cracks, such as the pair of micro-cracks 18a and 18b, form within the bottom surface of an integrated circuit die, such as the integrated circuit die 12b, at locations corresponding to the locations where the ejection probes or needles have either tensioned or pierced the adhesive tape backing to facilitate removal of the integrated circuit die from the adhesive tape backing. The micro-cracks are often readily formed since it is typically desired to employ within the adhesive layer of the adhesive tape backing an adhesive having a strong adhesive character. The strong adhesive character of the adhesive within the adhesive layer allows for ready and effective positioning of the semiconductor substrate wafer from which is formed the integrated circuit dice so that there is limited lateral or transverse movement of the semiconductor substrate wafer with respect to the adhesive tape backing incident to and during the dicing method through which the integrated circuit dice are formed from the semiconductor substrate wafer.

Thus, although it is of significant importance that the adhesive within the adhesive layer of an adhesive tape backing has a strong adhesive character to assure limited lateral or transverse movement of a semiconductor substrate wafer with respect to the adhesive tape backing incident to and during dicing of the semiconductor substrate wafer, it is also of significant importance that the integrated circuit dice so formed from the semiconductor substrate wafer positioned upon the adhesive tape backing be readily removed from the adhesive tape backing in a fashion such that there is not sustained by the integrated circuit dice the formation of micro-cracks or other damage associated with removing the integrated circuit dice from the adhesive tape backing. It is towards providing a method and apparatus which exhibit these apparently contradictory characteristics that the present invention is generally directed.

Novel methods and apparatus which may be employed in fabricating integrated circuit dice into integrated circuit packages are known in the art of integrated circuit fabrication. For example, Scheuenpflug in U.S. Pat. No. 5,270,260 discloses a method and apparatus for efficiently transferring an integrated circuit die from an adhesive tape backing to a integrated circuit carrier spaced closely from the integrated circuit die. In addition, Roberts, Jr. et al. in U.S. Pat. No. 5,362,681 disclose a method for parting from a semiconductor substrate wafer an integrated circuit die having particularly fragile structures formed upon the integrated circuit die. The method includes mounting the semiconductor substrate wafer face down upon a perforated adhesive tape backing, where the fragile structures within the integrated circuit die are positioned within a perforation of the perforated adhesive tape backing. Finally, McKenna et al. in U.S. Pat. No. 5,482,899 disclose a method and apparatus for removing an adhesive tape backing from a semiconductor substrate wafer within which there have been formed kerfs only partially through the semiconductor substrate wafer. The method and apparatus employ a leveling block which reduces physical stress incident to removing the adhesive tape backing from the semiconductor substrate wafer.

Desirable in the art are additional methods and apparatus through which there may be delaminated, within the context of a pick-and-place processing method, an integrated circuit die from an adhesive tape backing, where an adhesive within an adhesive layer within the adhesive tape backing has a strong adhesive character for the integrated circuit die, without forming micro-cracks within the integrated circuit die. Particularly desirable are methods and apparatus which fulfill the foregoing characteristics while simultaneously maintaining the positional integrity of the integrated circuit die with respect to the adhesive tape backing such that operability of the pick-and-place processing method is not compromised. It is towards these goals that the present invention is specifically directed.

SUMMARY OF THE INVENTION

A first object of the present invention is to provide a method and apparatus for delaminating, within the context of a pick-and-place processing method, an integrated circuit die from an adhesive tape backing.

A second object of the present invention is to provide a method and apparatus in accord with the first object of the present invention, where the integrated circuit die when delaminated from the adhesive tape backing is delaminated without forming micro-cracks within the integrated circuit die.

A third object of the present invention is to provide a method and apparatus in accord with the first object of the present invention and the second object of the present invention, where the integrated circuit die when delaminated from the adhesive tape backing simultaneously maintains the positional integrity of the integrated circuit die with respect to the adhesive tape backing such that operability of the pick-and-place processing method is not compromised.

A fourth object of the present invention is to provide a method and apparatus in accord with the first object of the present invention, the second object of the present invention and the third object of the present invention, which method and apparatus is readily manufacturable.

In accord with the objects of the present invention there is provided by the present invention a method and an apparatus for delaminating, within the context of a pick-and-place processing method, an integrated circuit die from an adhesive tape backing. To practice the method of the present invention, there is provided upon an adhesive tape backing an integrated circuit die. The adhesive tape backing comprises a carrier layer and an adhesive layer formed over the carrier layer, where the adhesive layer is positioned between the integrated circuit die and the carrier layer. The adhesive layer has a first portion of the adhesive layer aligned with the integrated circuit die. The adhesive character of the first portion of the adhesive layer is susceptible to substantially complete degradation through exposure to a dose of radiation. There is then exposed selectively the first portion of the adhesive layer to the dose of radiation. Finally, the integrated circuit die is removed from the adhesive tape backing. The present invention also contemplates: (1) an apparatus through which the method of the present invention may be practiced; and (2) an ultra-violet (UV) sensitive adhesive tape backing construction which may be employed within the preferred embodiment of the method and apparatus of the present invention.

Through the method and apparatus of the present invention there may be delaminated, within the context of a pick-and-place processing method, an integrated circuit die from an adhesive tape backing, where the integrated circuit die is delaminated from the adhesive tape backing without forming micro-cracks within the integrated circuit die. Through the selective exposure of a first portion of the adhesive layer beneath the integrated circuit die to the dose of radiation, and the concomitant substantially complete degradation of the adhesive character of the first portion of the adhesive layer beneath the integrated circuit die, the integrated circuit die may be delaminated from the adhesive tape backing without forming micro-cracks within the integrated circuit die.

Through the method and apparatus of the present invention there may be delaminated, within the context of a pick-and-place processing method, an integrated circuit die from an adhesive tape backing, where the integrated circuit die is delaminated from the adhesive tape backing while simultaneously maintaining the positional integrity of the integrated circuit die with respect to the adhesive tape backing, such that operability of the pick-and-place processing method is not compromised. Since the method and apparatus of the present invention provide for a selective exposure to a dose of radiation of a portion of the adhesive layer upon which is positioned the integrated circuit die, the positional integrity of the integrated circuit die which is delaminated from the adhesive tape backing, as well as the positional integrity of other integrated circuit dice which adjoin the integrated circuit die which is delaminated from the adhesive tape backing, is maintained.

The method and apparatus of the present invention are readily manufacturable. Methods and apparatus through which, in general, a light radiation source may be employed to provide selectively a dose of light radiation to a portion of a semiconductor substrate are known in the art of integrated circuit fabrication. Such methods and apparatus are readily adaptable to the method and apparatus of the present invention where a radiation source is adapted to expose selectively a first portion of an adhesive layer aligned beneath an integrated circuit die when delaminating the integrated circuit die from an adhesive tape backing comprising the first portion of the adhesive layer. Therefore, the method and apparatus of the present invention are readily manufacturable.

BRIEF DESCRIPTION OF THE DRAWINGS

The objects, features and advantages of the present invention are understood within the context of the Description of the Preferred Embodiment, as set forth below. The Description of the Preferred Embodiment is understood within the context of the accompanying drawings, which form a material part of this disclosure, wherein.

DESCRIPTION OF THE PREFERRED EMBODIMENT

The present invention provides a method and apparatus through which there may be delaminated, within the context of a pick-and-place processing method, an integrated circuit die from an adhesive tape backing without forming micro-cracks within the integrated circuit die. The method and apparatus of the present invention achieve this goal through the selective exposure of a first portion of an adhesive layer beneath the integrated circuit die to a dose of radiation sufficient to substantially completely degrade the adhesive character of the first portion of the adhesive layer. In conjunction with a carrier layer, the first portion of the adhesive layer comprises the adhesive tape backing. The integrated circuit die may then be removed from the adhesive tape backing without forming micro-cracks within the integrated circuit die.

The method and apparatus of the present invention may be employed in delaminating, within the context of a pick-and-place processing method, various types of integrated circuit dice from a radiation sensitive adhesive tape backing. The method and apparatus of the present invention may be employed in delaminating from radiation sensitive adhesive tape backings integrated circuit dice including but not limited to Dynamic Random Access Memory (DRAM) integrated circuit dice, Static Random Access Memory (SRAM) integrated circuit dice, Application Specific Integrated Circuit (ASIC) integrated circuit dice, microprocessor integrated circuit dice, integrated circuit dice having within their fabrications field effect transistors (FETs), integrated circuit dice having within their fabrications bipolar transistors and integrated circuit dice having within their fabrications Bipolar Complementary Metal Oxide Semiconductor (BiCMOS) transistors. The method and apparatus of the present invention have broad applicability in delaminating, within the context of a pick-and-place processing method, various types of integrated circuit dice from radiation sensitive adhesive tape backings.

Although the preferred embodiment of the method and apparatus of the present invention employ an ultra-violet (UV) radiation sensitive adhesive tape backing comprising an ultra-violet (UV) radiation sensitive adhesive layer, the adhesive character of portions of which ultra-violet (UV) radiation sensitive adhesive layer may selectively be substantially completely degraded through exposure to a dose of ultra-violet (UV) radiation, it is understood by a person skilled in the art that the method and apparatus of the present invention are not limited exclusively to employing an ultra-violet (UV) radiation sensitive adhesive tape backing. The method and apparatus of the present invention may employ a radiation sensitive adhesive tape backing other than an ultra-violet (UV) radiation sensitive adhesive tape backing provided that: (1) a radiation sensitive adhesive layer within the radiation sensitive adhesive tape backing is properly matched to a radiation source which selectively provides a dose of radiation to a portion of the radiation sensitive adhesive layer beneath an integrated circuit die positioned upon the radiation sensitive adhesive layer sufficient to substantially completely degrade the adhesive character of the portion of the radiation sensitive adhesive layer; and (2) a carrier layer within the radiation sensitive adhesive tape backing is either transparent to the dose of radiation or the dose of radiation is otherwise provided to the portion of the radiation sensitive adhesive layer having the integrated circuit die positioned thereupon.

Examples of radiation sensitive adhesive tape backings, other than ultra-violet (UV) radiation sensitive adhesive tape backings, which may be employed within the method and apparatus of the present invention include but are not limited to infrared (IR) radiation sensitive adhesive tape backings, visible light radiation sensitive adhesive tape backings and electron beam radiation sensitive adhesive tape backings. Under circumstances where the radiation sensitive adhesive tape backing is a visible light radiation sensitive adhesive tape backing, a portion of a visible light radiation sensitive adhesive layer within the visible light radiation sensitive adhesive tape backing preferably requires a particularly intense dose of visible light radiation in order to substantially completely degrade the adhesive character of the portion of the visible light radiation sensitive adhesive layer when the portion of the visible light radiation sensitive adhesive layer has an integrated circuit die positioned thereupon. Preferably, the particularly intense dose of visible light radiation is at least several times the dose of visible light radiation that the portion of the visible light radiation sensitive adhesive layer is expected to receive incident to routine integrated circuit fabrication operations absent the intense dose of visible light radiation. Under such circumstances, an integrated circuit die positioned upon the portion of the visible light radiation sensitive adhesive layer is less likely to inadvertently delaminate from the visible light radiation sensitive adhesive tape backing.

Referring now to FIG. 3 to FIG. 6 there is shown a series of schematic cross-sectional diagrams illustrating the preferred embodiment of the method and apparatus through which there may be delaminated, within the context of a pick-and-place processing method, an integrated circuit die from a radiation sensitive adhesive tape backing. Shown in FIG. 1 is a schematic cross-sectional diagram illustrating the apparatus at early stages in the practice of the method.

Figure 3:
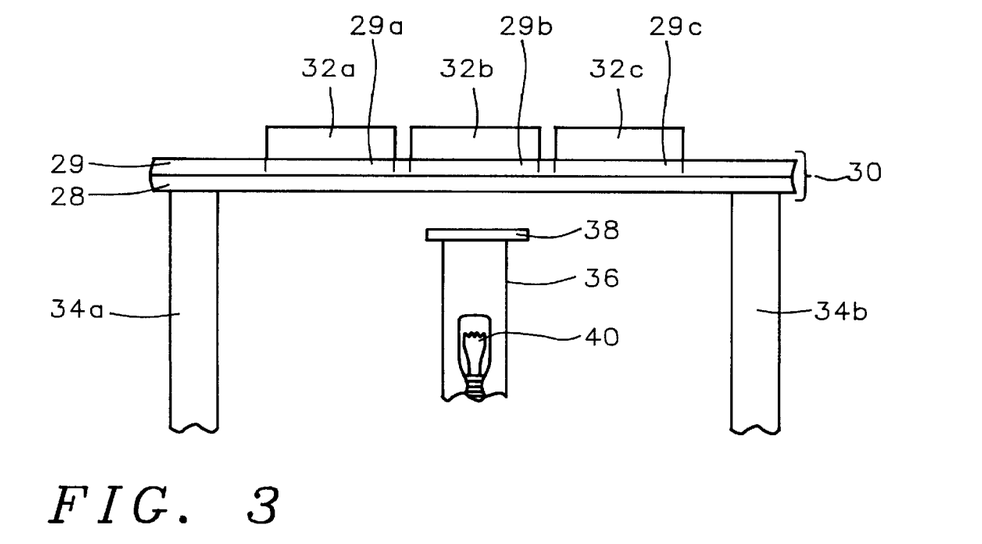
FIG. 3 to FIG. 6 show a series of schematic cross-sectional diagrams illustrating a method and apparatus in accord with the preferred embodiment of the method and apparatus of the present invention through which an integrated circuit die is delaminated from an adhesive tape backing without forming micro-cracks within the integrated circuit die.

Shown in FIG. 3 is an ultra-violet (UV) sensitive adhesive tape backing 30 which is comprised of a carrier layer 28 upon which is formed an ultra-violet (UV) sensitive adhesive layer 29. Positioned upon the ultra-violet (UV) sensitive adhesive layer 29 is a series of integrated circuit dice 32a, 32b and 32c which are typically formed through dicing through a method as is conventional in the art of a semiconductor substrate wafer previously positioned upon the ultra-violet (UV) sensitive adhesive tape backing 30. Typically and preferably, each individual integrated circuit die 32a, 32b or 32c within the series of integrated circuit dice 32a, 32b and 32b has a surface area of from about 0.005 to about 2 square inches (in2). Although there are several materials as are known in the art from which a carrier layer within an adhesive tape backing may be formed, including but not limited to metal layers, ceramic layers and polymer film layers, the carrier layer 28 within the ultra-violet (UV) sensitive adhesive tape backing 30 employed within the preferred embodiment of the method and apparatus of the present invention is preferably formed from a polymer film, where the polymer material within in the polymer film is substantially transparent to a dose of ultra-violet (UV) radiation which will subsequently be provided through the carrier layer 28. Typically and preferably, the carrier layer 28 has a thickness of from about 2 to about 100 milli-inches (mils).

With regard to the ultra-violet (UV) sensitive adhesive layer 29, there are, as is shown in FIG. 3, three portions of the ultra-violet (UV) sensitive adhesive layer 29 which are defined with respect each one of the integrated circuit dice 32a, 32b and 32c positioned thereover. The three portions of the ultra-violet (UV) sensitive adhesive layer 29 may be derived from a completely or partially contiguous ultraviolet (UV) sensitive adhesive layer 29 by means of a limited or partial dicing of the ultra-violet (UV) sensitive adhesive layer 29 incident to dicing of a semiconductor substrate wafer into the integrated circuit dice 32a, 32b and 32c, as shown in FIG. 3. Alternatively, the three portions of the ultra-violet (UV) sensitive adhesive layer 29 may be completely separated by means of complete dicing of the ultra-violet (UV) sensitive adhesive layer 29 incident to dicing of the semiconductor substrate wafer into the integrated circuit dice 32a, 32b and 32c (not shown in FIG. 3). When the three portions of the ultra-violet (UV) sensitive adhesive layer 29 are completely separated by means of complete dicing of the ultra-violet (UV) sensitive adhesive layer 29, there is inherently avoided propagation from beyond the boundaries of a completely diced ultra-violet (UV) sensitive patterned adhesive layer so formed an ultraviolet (UV) radiation induced reaction through which the adhesive character of the completely diced ultra-violet (UV) sensitive patterned adhesive layer so formed is substantially completely degraded. As illustrated in FIG. 3, there is a first portion of the ultra-violet (UV) sensitive adhesive layer 29a aligned beneath the integrated circuit die 32a, a second portion of the ultra-violet (UV) sensitive adhesive layer 29b aligned beneath the integrated circuit die 32b and a third portion of the ultra-violet (UV) sensitive adhesive layer 29c aligned beneath the integrated circuit die 32c. Each of the first portion, the second portion and the third portion of the ultra-violet (UV) sensitive adhesive layer 29a, 29b and 29c is susceptible to substantially complete degradation of the adhesive character of that portion of the ultra-violet (UV) sensitive adhesive layer 29 through exposure to the dose of ultra-violet (UV) radiation subsequently provided to that portion of the ultra-violet (UV) sensitive adhesive layer 29 through the carrier layer 28.

The formulation of an ultra-violet (UV) sensitive adhesive which may be employed in forming the ultra-violet (UV) sensitive adhesive layer 29 such that the adhesive character of portions of the ultra-violet (UV) sensitive adhesive layer 29 upon which are positioned the integrated circuit dice 32a, 32b and 32c may selectively be substantially completely degraded through exposure to a dose of ultra-violet (UV) radiation is in part the invention to which the preferred embodiment of the method and apparatus of the present disclosure is directed. There may exist several alternative methods and materials for forming the ultra-violet (UV) sensitive adhesive layer 29. Included, but not limiting, among these methods and materials are ultra-violet (UV) sensitive adhesive layers formed from ultra-violet (UV) sensitive adhesives whose adhesive character is substantially completely degraded through a more complete polymerization of the ultra-violet (UV) sensitive adhesive, as well as ultra-violet (UV) sensitive adhesive layers formed from ultra-violet (UV) sensitive adhesives whose adhesive character is substantially completely degraded through an ultra-violet (UV) photoinitiated generation of a release material to the interface between the ultra-violet (UV) sensitive adhesive layer and an integrated circuit die positioned upon the ultra-violet (UV) sensitive adhesive layer. Such ultra-violet (UV) sensitive adhesives may include, but are not limited to, ultra-violet (UV) sensitive polymer adhesives including but not limited to ultra-violet (UV) sensitive acrylic polymer adhesives and ultra-violet (UV) sensitive urethane polymer adhesives. Either of the foregoing ultraviolet (UV) sensitive polymer adhesives, or any of several other ultra-violet (UV) sensitive polymer adhesives, may be employed in forming the ultra-violet (UV) sensitive adhesive layer 29 within the ultra-violet (UV) sensitive adhesive tape backing 30 employed within the preferred embodiment of the method and apparatus of the present invention. Typically, the thickness of the ultra-violet (UV) sensitive adhesive layer 29 within the ultra-violet (UV) sensitive adhesive tape backing 30 is from about 1 to about 50 milli-inches (mils).

There is also shown within FIG. 3 a first part of an apparatus housing 34a and a second part of the apparatus housing 34b, both of which serve directly or indirectly as a base upon which various portions of the preferred embodiment of the apparatus of the present invention may be assembled. With respect to the ultra-violet (UV) sensitive adhesive tape backing 30, the first part of the apparatus housing 34a and the second part of the apparatus housing 34b serve as locations for fixturing upon the preferred embodiment of the apparatus of the present invention the ultra-violet (UV) sensitive adhesive tape backing 30. Although not specifically illustrated within FIG. 3, any of several fixturing means as are known in the art may be employed when fixturing within the preferred embodiment of the method and apparatus of the present invention the ultra-violet (UV) sensitive adhesive tape backing 30 to the first part of the apparatus housing 34a and the second part of the apparatus housing 34b.

Finally, there is shown within FIG. 3 an ultra-violet (UV) lamp 40 contained within an ultra-violet (UV) lamp housing 36, where the ultra-violet (UV) lamp housing 36 has a lens 38 covering an opening in the ultra-violet (UV) lamp housing 36 which is positioned beneath the carrier layer 28 at the location opposite the second portion of the ultra-violet (UV) sensitive adhesive layer 29b. Although not specifically illustrated within FIG. 3, the ultra-violet (UV) lamp housing 36 is also directly or indirectly assembled to the first part of the apparatus housing 34a or the second portion of the apparatus housing 34b in a fashion which allows the ultraviolet (UV) lamp housing 36 to be positioned with respect to at least the first portion of the ultra-violet (UV) sensitive adhesive layer 29a, the second portion of the ultra-violet (UV) sensitive adhesive layer 29b and the third portion of the ultra-violet (UV) sensitive adhesive layer 29c. Such positioning is preferably undertaken through a step-and-repeat mechanism similar to the step-and-repeat mechanism typically employed within the photoexposure methodology and apparatus typically employed in photoexposing photoresist coated semiconductor substrate wafers. Other positioning mechanisms may, however, be employed. The lens 38 attached to the ultra-violet (UV) lamp housing 36 is preferably replaceable and preferably designed to provide an optical dispersion suitable to provide a dose of ultra-violet (UV) radiation from the ultra-violet (UV) lamp 40 selectively through the carrier layer 28 into a portion of the ultra-violet (UV) sensitive adhesive layer 29 including but not limited to the first portion of the ultra-violet (UV) sensitive adhesive layer 29a, the second portion of the ultra-violet (UV) sensitive adhesive layer 29b and the third portion of the ultra-violet (UV) sensitive adhesive layer 29c. Finally, the wavelength and energy of the ultra-violet (UV) lamp 40 within the ultra-violet (UV) lamp housing 36 are preferably chosen such that the dose of ultra-violet (UV) radiation may be provided from the ultra-violet (UV) lamp 40, through the lens 38 and the carrier layer 28, and into a portion of the ultra-violet (UV) sensitive adhesive layer 29 including but not limited to the first portion of the ultra-violet (UV) sensitive adhesive layer 29a, the second portion of the ultra-violet (UV) sensitive adhesive layer 29b and the third portion of the ultra-violet (UV) sensitive adhesive layer 29c within a commercially reasonable exposure time, preferably less than about one second.

Figure 4:
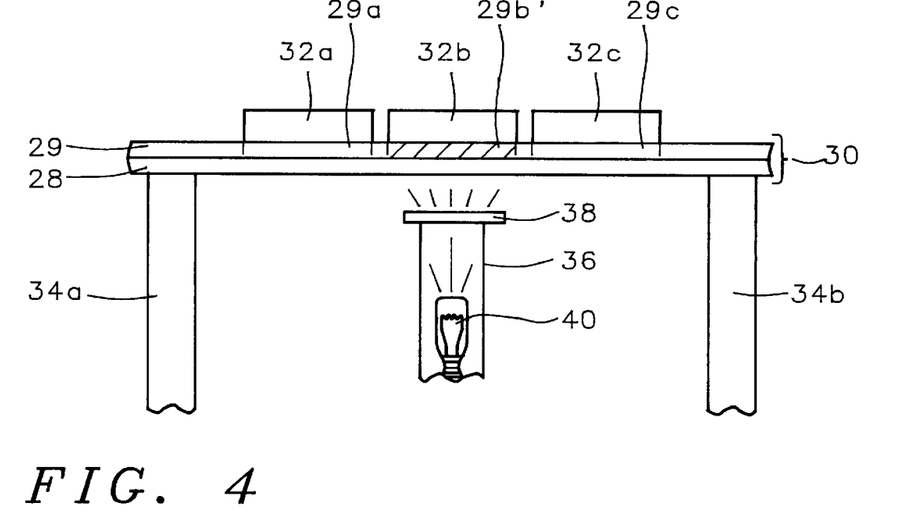

Referring now to FIG. 4, there is shown a schematic cross-sectional diagram illustrating the results of further processing of the integrated circuit die 32b through the preferred embodiment of the method and apparatus of the present invention. As shown in FIG. 4, the ultra-violet (UV) lamp 40 within the ultra-violet (UV) lamp housing 36 has been energized to provide a dose of ultra-violet (UV) radiation through the lens 38 and the carrier layer 28 selectively into the second portion of the ultra-violet (UV) sensitive adhesive layer 29b. The dose of ultra-violet (UV) radiation is of a magnitude sufficient to substantially completely degrade the adhesive character of the second portion of the ultra-violet (UV) sensitive adhesive layer 29b, thus forming the non-adhesive second portion of the ultra-violet (UV) sensitive adhesive layer 29b'. At this point in the processing of the integrated circuit die 32b, the integrated circuit die 32b may be lifted from the surface of the ultra-violet (UV) sensitive adhesive tape backing 30 with minimal effort and without forming micro-cracks within the integrated circuit die 32b. Typically, although not exclusively, the integrated circuit die 32b will be lifted from the surface of the ultra-violet (UV) sensitive adhesive tape backing 30 through action of a vacuum wand contacting the surface of the integrated circuit die 32b opposite the ultra-violet (UV) sensitive adhesive tape backing 30.

For purposes of comparison, within the context of the method and apparatus of the present invention, the adhesive character of a portion of a radiation sensitive adhesive layer within a radiation sensitive adhesive tape backing, such as the second portion of the ultra-violet (UV) sensitive adhesive layer 29b within the ultra-violet (UV) sensitive adhesive tape backing 30, will typically have a peel strength of from about 0.2 to about 10 pounds per inch contact width of the portion of the radiation sensitive adhesive layer with an integrated circuit die, such as the integrated circuit die 32b, positioned upon the portion of the radiation sensitive adhesive layer absent exposure of the portion of the radiation sensitive adhesive layer within the radiation sensitive adhesive tape backing to a dose of radiation, such as a dose of ultra-violet (UV) radiation, sufficient to substantially completely degrade the adhesive character of the portion of the radiation sensitive adhesive layer. Analogously, within context of the method and apparatus of the present invention where the portion of the radiation sensitive adhesive layer, such as the second portion of the ultra-violet (UV) sensitive adhesive layer 29b, of surface area about 0.005 to about 2 square inches, receives a dose of radiation, such as a dose of ultra-violet (UV) radiation, sufficient to completely degrade the adhesive character of the portion of the radiation sensitive adhesive layer, the portion of the radiation sensitive adhesive layer, such as the portion of the ultra-violet sensitive adhesive layer 29b, will typically have a peel strength of less than about 0.1 pound per inch contact width between the portion of the radiation sensitive adhesive layer and an integrated circuit die, such as the integrated circuit die 32b, positioned upon the portion of the radiation sensitive adhesive layer.

Thus, for the preferred embodiment of the method and apparatus of the present invention, a peel strength of less than about 0.1 pounds per inch contact width between: (1) a portion of an ultra-violet (UV) sensitive adhesive layer within an ultra-violet (UV) sensitive adhesive tape backing; and (2) an integrated circuit die positioned upon the portion of the ultra-violet (UV) sensitive adhesive layer, after providing a dose of ultra-violet (UV) radiation into the portion of the ultra-violet (UV) sensitive adhesive layer of the ultra-violet (UV) sensitive adhesive tape backing, is indicative of substantially complete degradation of the adhesive character of the portion of the ultra-violet (UV) sensitive adhesive layer.

Figure 5:
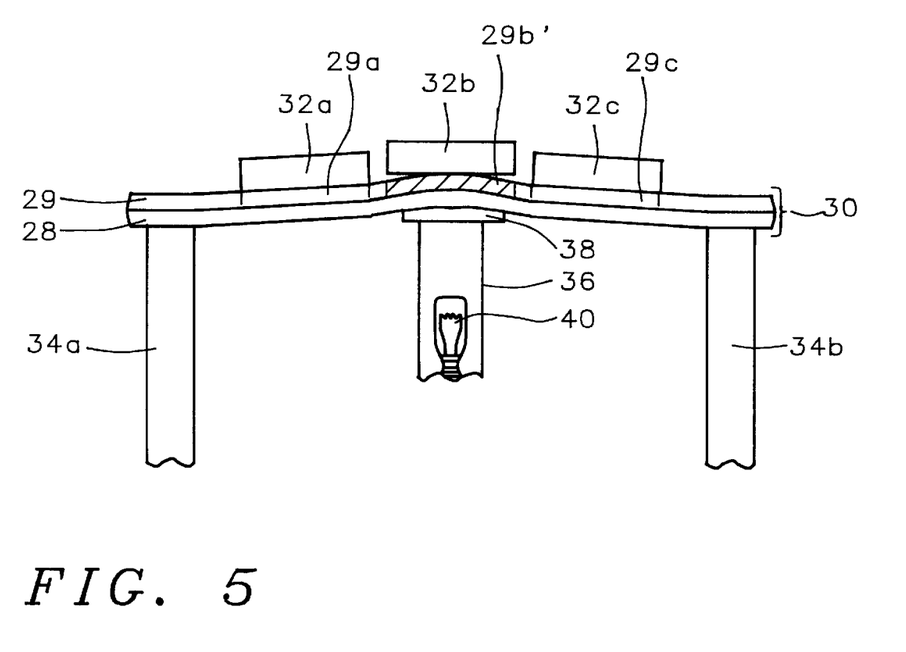

Referring now to FIG. 5, there is shown a schematic cross-sectional diagram illustrating the results of further processing of the integrated circuit die 32b through the preferred embodiment of the method and apparatus of the present invention. Shown in FIG. 5 is a schematic cross-sectional diagram otherwise equivalent to the schematic cross-sectional diagram of FIG. 4, but within which the ultra-violet (UV) lamp housing 36 has been repositioned to tension the portion of the carrier layer 28 beneath the non-adhesive second portion of the ultra-violet (UV) sensitive adhesive layer 29b' through contact with the lens 38. Such tensioning of the portion of the carrier layer 28 beneath the non-adhesive second portion of the ultra-violet (UV) sensitive adhesive layer 29b' is optional within the preferred embodiment of the method and apparatus of the present invention. Although optional, the tensioning of the portion of the carrier layer 28 beneath the non-adhesive second portion of the ultra-violet (UV) sensitive adhesive layer 29b' serves to further facilitate the removal of the integrated circuit die 32b from the ultra-violet (UV) sensitive adhesive tape backing 30. The portion of the carrier layer 28 beneath the non-adhesive second portion of the ultra-violet (UV) sensitive adhesive layer 29b' may be tensioned by contact with the lens 38 through movement of the ultra-violet (UV) lamp housing 36 either before, simultaneously with or after the ultra-violet (UV) lamp 40 within the ultra-violet (UV) lamp housing 36 has been energized to provide the dose of ultra-violet (UV) radiation through the lens 38 and the carrier layer 28 selectively into the second portion of the ultra-violet (UV) sensitive adhesive layer 29b when forming the non-adhesive second portion of the ultra-violet (UV) sensitive adhesive layer 29b' from the second portion of the ultra-violet (UV) sensitive adhesive layer 29b. Typically and preferably, the carrier layer 28 beneath the second portion of the ultra-violet (UV) sensitive adhesive layer 29b or the non-adhesive second portion of the ultra-violet (UV) sensitive adhesive layer 29b' is tensioned to a distance of from about 0.1 to about 5 milli-inches (mils) above its otherwise nominally planar position.

Figure 6:
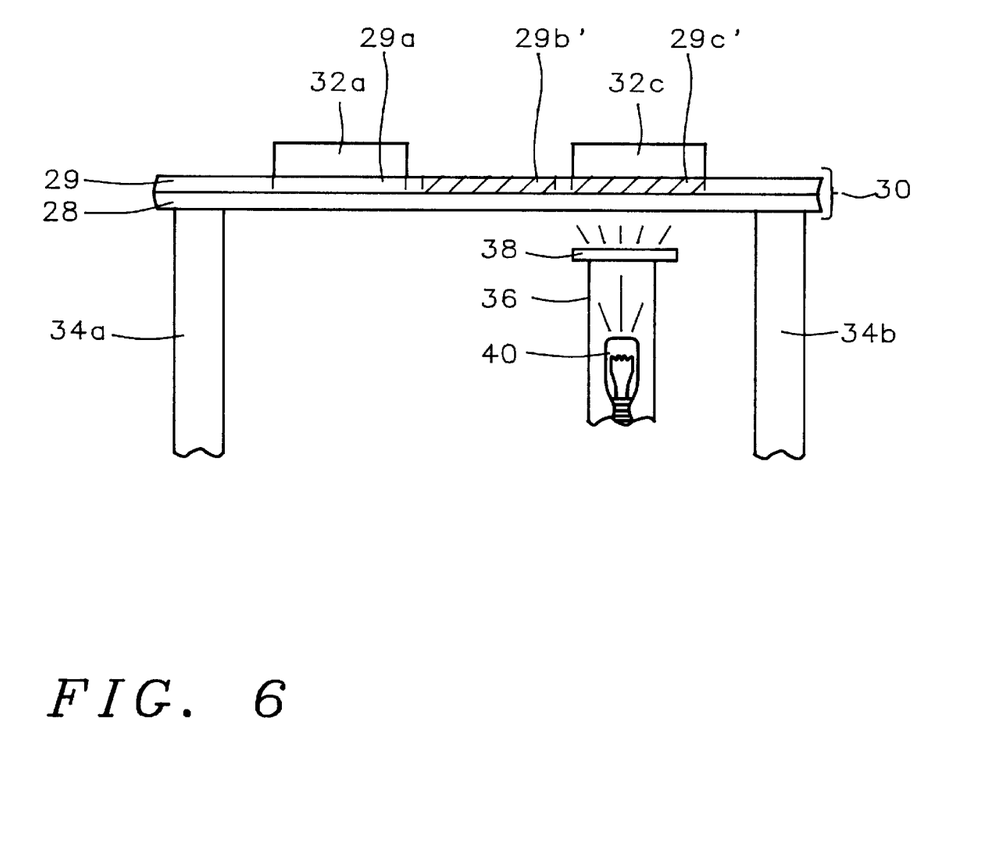

Referring now to FIG. 6, there is shown a schematic cross-sectional diagram illustrating the results of further processing of the integrated circuit die 32c through the preferred embodiment of the method and apparatus of the present invention. Shown in FIG. 6 is a schematic cross-sectional diagram otherwise equivalent to the schematic cross-sectional diagram of FIG. 5, but within which the integrated circuit die 32b has been removed from the ultra-violet (UV) sensitive adhesive tape backing 30. The integrated circuit die 32b may be removed from the ultra-violet (UV) sensitive adhesive tape backing 30 through methods as disclosed above, which will typically, although not exclusively, employ a vacuum wand applied to the surface of the integrated circuit die 32b opposite the ultra-violet (UV) sensitive adhesive tape backing 30. In addition, as is also shown in FIG. 6, the ultra-violet (UV) lamp housing 36 has been repositioned, preferably through the step-and-repeat mechanism, to a position beneath the carrier layer 28 corresponding with the third portion of the ultra-violet (UV) sensitive adhesive layer 29c. Finally there is provided from the ultra-violet (UV) lamp 40 through the lens 38 and the carrier layer 28 a second dose of ultra-violet (UV) radiation selectively into the third portion of the ultra-violet (UV) sensitive adhesive layer 29c. The second dose of ultra-violet (UV) radiation provided into the third portion of the ultra-violet (UV) sensitive adhesive layer 29c is sufficient to substantially completely degrade the adhesive character of the third portion of the ultra-violet (UV) sensitive adhesive layer 29c, thus forming the non-adhesive third portion of the ultra-violet (UV) sensitive adhesive layer 29c'. The integrated circuit die 32c may then be removed from the ultra-violet (UV) sensitive adhesive tape backing 30 through additional processing within the preferred embodiment of the method and apparatus of the present invention analogous to the additional processing employed in removing from the ultra-violet (UV) sensitive adhesive tape backing 30 the integrated circuit die 32b. When removed, the integrated circuit die 32c exhibits no micro-cracks. In addition, the positional integrity of the remaining integrated circuit dice adjoining the integrated circuit die 32b and the integrated circuit die 32c is also maintained while the integrated circuit die 32b is delaminated from the second portion of the ultra-violet (UV) sensitive adhesive layer 29b and the integrated circuit die 32c is delaminated from the third portion of the ultra-violet (UV) sensitive adhesive layer 29c.

As is understood by a person skilled in the art, the preferred embodiment of the method and apparatus of the present invention may be employed in delaminating from the ultra-violet (UV) sensitive adhesive tape backing 30 integrated circuit dice in addition to the integrated circuit die 32b and the integrated circuit die 32c. The additional integrated circuit dice are typically positioned upon the ultra-violet (UV) sensitive adhesive tape backing 30 within the two directions of the primary plane of the ultra-violet (UV) sensitive adhesive tape backing 30. The additional integrated circuit dice may be delaminated from the ultra-violet (UV) sensitive adhesive tape backing 30 through two dimensional movement within the primary plane of the ultra-violet (UV) sensitive adhesive tape backing 30 of the ultra-violet (UV) lamp housing 36, followed by selectively providing a dose of ultra-violet (UV) radiation from the ultra-violet (UV) lamp 40 through the lens 38 and the carrier layer 28 into a portion of the ultra-violet (UV) sensitive adhesive layer 29 beneath the integrated circuit die desired to be removed. Typically and preferably, the two dimensional movement of the ultra-violet (UV) lamp housing 36 is undertaken through the step-and-repeat mechanism.

As is also understood by a person skilled in the art, the preferred embodiment of the method, apparatus and ultra-violet (UV) sensitive adhesive tape backing of the present invention is illustrative of the method, apparatus and radiation sensitive adhesive tape backing of the present invention rather than limiting of the method, apparatus and radiation sensitive adhesive tape backing of the present invention. Revisions may be made to methods, materials, structures, dimensions and components through which is provided the preferred embodiment of the method, apparatus and ultra-violet (UV) sensitive adhesive tape backing of the present invention while still providing a method, apparatus or radiation sensitive adhesive tape backing which is within the spirit and scope of the present invention, as provided by the appended claims.

In that regard, as is further understood by a person skilled in the art it is also feasible within the method and apparatus of the present invention to fabricate an apparatus where the relative positioning of a radiation sensitive adhesive tape backing with respect to a radiation source is reversed in comparison with the ultra-violet (UV) sensitive adhesive tape backing 30 and the ultra-violet (UV) lamp housing 36 as defined within the preferred embodiment of the method of the present invention and illustrated in FIG. 3 to FIG. 6. Such a reversed positioning of a radiation sensitive adhesive tape backing, such as the ultra-violet (UV) sensitive adhesive tape backing 30, and radiation source, such as the ultra-violet (UV) lamp housing 36, may provide an apparatus where removal of an integrated circuit die from the radiation sensitive adhesive tape backing, once the integrated circuit die is delaminated from the radiation sensitive adhesive tape backing through providing selectively a dose of radiation, such as ultra-violet (UV) radiation, into the portion of a radiation sensitive adhesive layer, such as the ultra-violet (UV) sensitive adhesive layer 29 above (rather than below) the integrated circuit die, may be assisted by gravity. Through such a method and apparatus a micro-crack free integrated circuit die may be fabricated through a pick-and-place processing method into an integrated circuit package with minimal abrasion or pressure upon the exposed surface of the integrated circuit die which has formed therein and/or thereupon electrical circuit devices, conductor layers, insulator layers, connections and interconnections.

What is claimed is:

1. A method for delaminating from an adhesive tape backing an integrated circuit die comprising:
   providing an adhesive tape backing comprising:
      a carrier layer; and
      a blanket adhesive layer formed over the carrier layer;
   positioning upon the blanket adhesive layer a semiconductor substrate wafer;
   dicing the semiconductor substrate wafer to form an integrated circuit die while simultaneously dicing completely through the blanket adhesive layer to form a patterned adhesive layer coextensive with the integrated circuit die, the integrated circuit die and the coextensive patterned adhesive layer being separated from a second integrated circuit die coextensive with a second patterned adhesive layer, the adhesive character of the patterned adhesive layer being susceptible to substantially complete degradation through exposure to a dose of radiation;
   exposing selectively and irradiating completely the patterned adhesive layer with the dose of radiation while neither exposing nor irradiating the second patterned adhesive layer with the dose of radiation; and removing the integrated circuit die from the adhesive tape backing.

2. The method of claim 1 wherein the surface area of the integrated circuit die and surface area of the patterned adhesive layer are from about 0.005 to about 2 square inches each.

3. The method of claim 1 wherein the dose of radiation is a dose of ultra-violet (UV) radiation.

4. The method of claim 3 wherein the carrier layer is formed from a polymer film of thickness about 2 to about 100 milli-inches (mils), the polymer film being substantially transparent to the dose of ultra-violet (UV) radiation.

5. The method of claim 3 wherein the blanket adhesive layer is an ultra-violet (UV) sensitive adhesive layer formed to a thickness of from about 1 to about 50 milli-inches (mils) from an ultra-violet (UV) sensitive polymer adhesive chosen from the group of ultra-violet (UV) sensitive polymer adhesives consisting of ultra-violet (UV) sensitive acrylic polymer adhesives and ultra-violet (UV) sensitive urethane polymer adhesives.

6. The method of claim 5 wherein the dose of the ultra-violet (UV) radiation is provided through the carrier layer to the patterned sensitive adhesive layer, the dose of ultra-violet (UV) radiation being provided through an ultra-violet (UV) radiation source positioned through a step-and-repeat mechanism.

7. The method of claim 1 wherein the integrated circuit die is removed from the adhesive tape backing employing a vacuum wand applied to the side of the integrated circuit die opposite the adhesive tape backing.

8. The method of claim 1 further comprising tensioning the carrier layer to elevate the first portion of the adhesive layer with respect to the remainder of the adhesive layer.

9. The method of claim 8 wherein the carrier layer is tensioned through contact with a housing which is employed in providing the dose of radiation to the patterned adhesive layer.

10. The method of claim 1 wherein the integrated circuit die is chosen from the group of integrated circuit dice consisting of Dynamic Random Access Memory (DRAM) integrated circuit dice, Static Random Access Memory (SRAM) integrated circuit dice, Application Specific Integrated Circuit (ASIC) dice and microprocessor integrated circuit dice.

11. The method of claim 1 wherein there is avoided propagation from beyond the patterned adhesive layer of a radiation induced reaction through which the adhesive character of the patterned adhesive layer is substantially completely degraded.

* * * * *